(12) United States Patent
Froehlich et al.

(10) Patent No.: US 8,779,772 B2
(45) Date of Patent: Jul. 15, 2014

(54) TRAVELLING-WAVE NUCLEAR MAGNETIC RESONANCE METHOD

(75) Inventors: Jürg Froehlich, Zürich (CH); David Brunner, Jona (CH); Klaas Prüssmann, Zürich (CA); Nicola De Zanche, Edmonton AB (CA)

(73) Assignees: Universität Zürich, Zürich (CH); Eidgenössische Technische Hochschule, Zürich (CH)

( * ) Notice: Subject to any disclaimer, the term of this patent is extended or adjusted under 35 U.S.C. 154(b) by 473 days.

(21) Appl. No.: 12/906,424

(22) Filed: Oct. 18, 2010

(65) Prior Publication Data

US 2011/0115486 A1     May 19, 2011

Related U.S. Application Data

(63) Continuation-in-part of application No. PCT/EP2009/002846, filed on Apr. 17, 2009.

(30) Foreign Application Priority Data

Apr. 18, 2008 (EP) .................................. 08007601

(51) Int. Cl.
*G01V 3/00* (2006.01)
(52) U.S. Cl.
USPC .......................................... 324/318; 324/322
(58) Field of Classification Search
USPC .......................................... 324/318, 322, 300
See application file for complete search history.

(56) References Cited

U.S. PATENT DOCUMENTS 5,017,872 A * 5/1991 Foo et al. ....................... 324/322
5,053,711 A * 10/1991 Hayes et al. ................... 324/318

OTHER PUBLICATIONS

P.B. Roemer et al., The NMR Phased Array, Magnetic Resonance in Medicine, 16: 192-225, 1990.
C. Balanis, Antenna Theory, Analysis and Design, Wiley, 1997.
D.M. Pozar,et al., Microwave Engineering, John Wiley and Sons, Inc., New York, 1998.
K.P. Pruessman et al., SENSE: Sensitivity Encoding for Fast MRI, Magnetic Resonance in Medicine, 42:952-962, 1999.
F. Wu et al., Electromagnetics, 21: 97-114, 2001.
C.A.T. Van Den Berg et al., Using the natural resonant modes of the RF cavity for whole body excitation at 7 T, ISMRM workshop Advances in high field MRI Asilomar, Mar. 25-28, 2007.
American Society for Testing and Materials, Designation: F 2182-02a—Standard Test Method for Measurement of Radio Frequency Induced Heating Near Passive Implants During Magnetic Resonance Imaging.

* cited by examiner

*Primary Examiner* — Louis Arana
(74) *Attorney, Agent, or Firm* — McCormick Paulding & Huber

(57) ABSTRACT

A method for acquiring an image or spectrum of a subject or object residing within the magnetic field of a magnetic resonance apparatus, comprises the steps of: executing a predetermined pulse sequence for applying gradient magnetic fields and for coupling in electromagnetic excitation pulses to induce nuclear magnetic resonance within the subject or object; detecting an electromagnetic signal resulting from said magnetic resonance; and constructing at least one image or magnetic resonance spectrum of said subject or object from said detected electromagnetic signal. According to the invention, said coupling in of the electromagnetic excitation pulse and/or said detecting of the electromagnetic signal are carried out substantially by means of travelling electromagnetic waves.

13 Claims, 9 Drawing Sheets
(7 of 9 Drawing Sheet(s) Filed in Color)

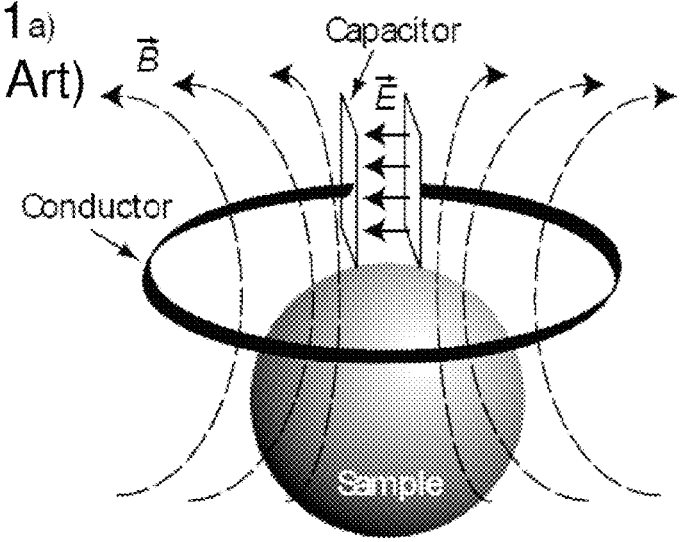
Fig. 1a) (Prior Art)
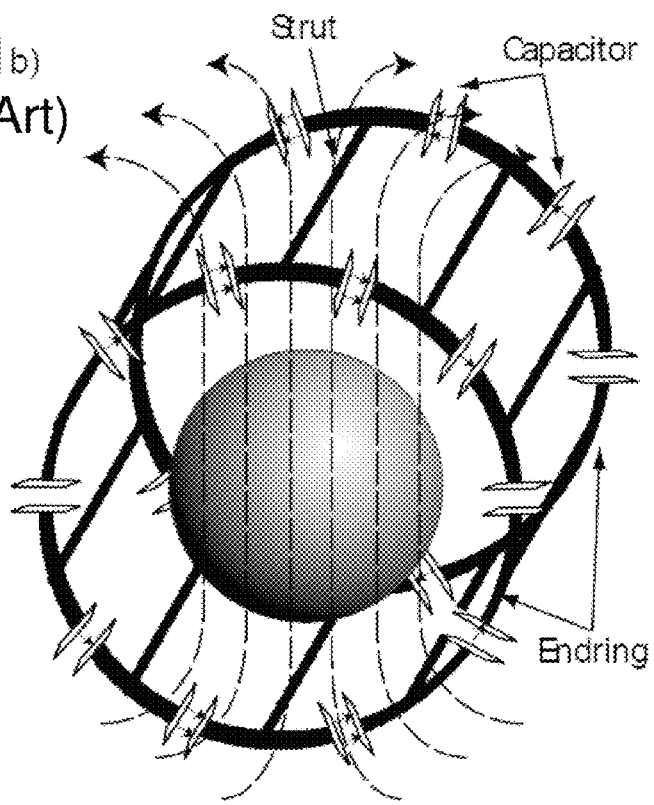
Fig. 1b) (Prior Art)

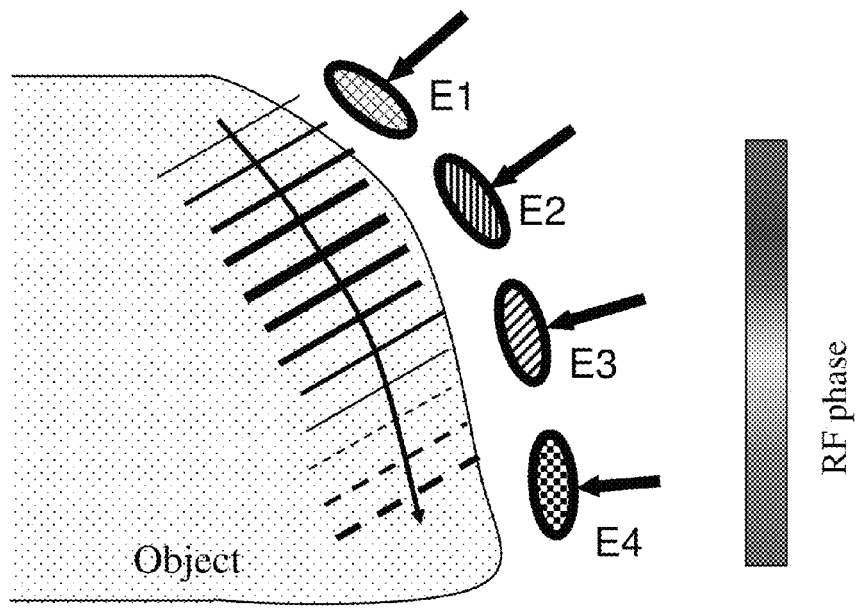
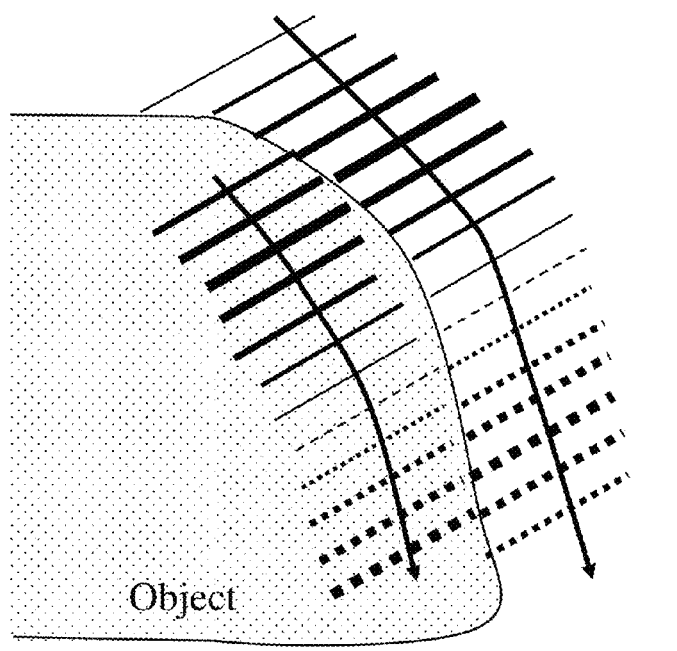

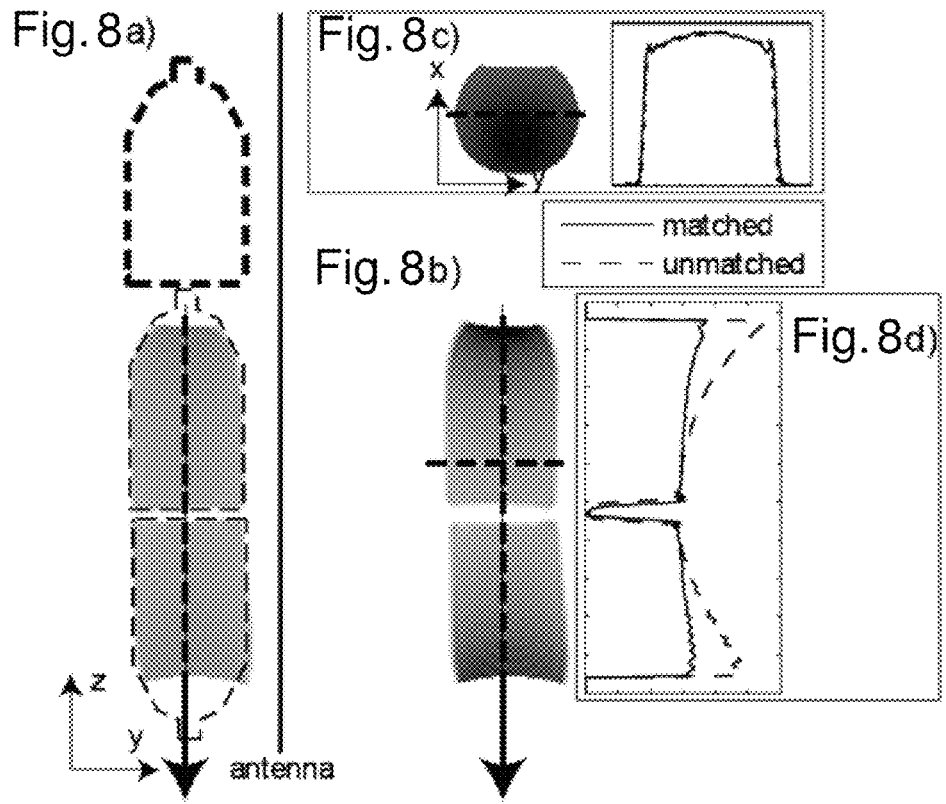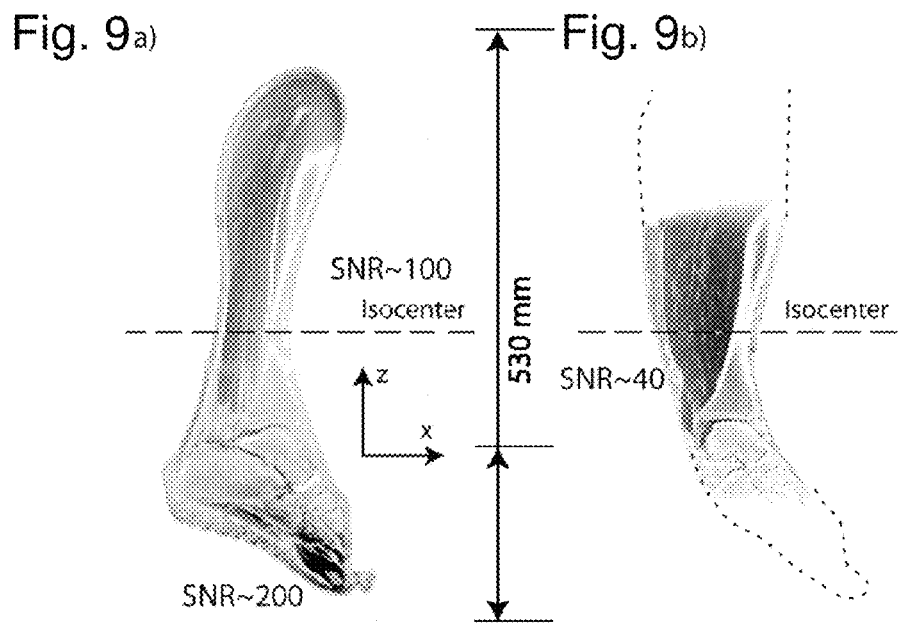

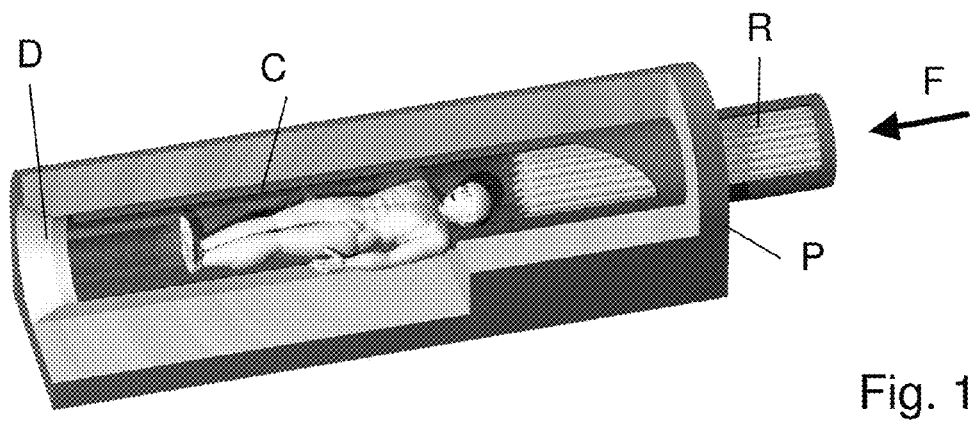
Fig. 10
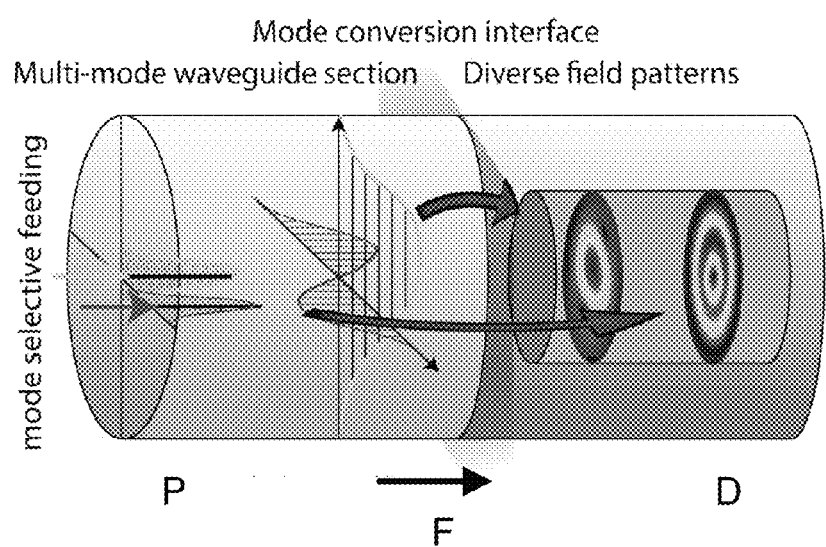
Fig. 11
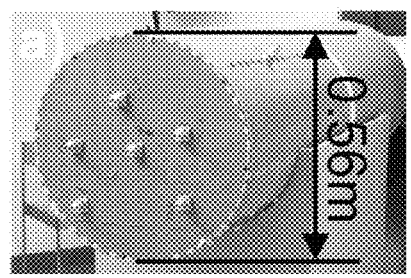 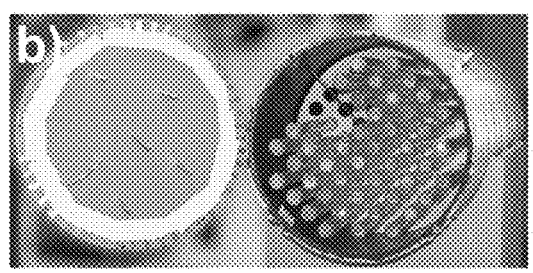
Fig. 12a          Fig. 12b

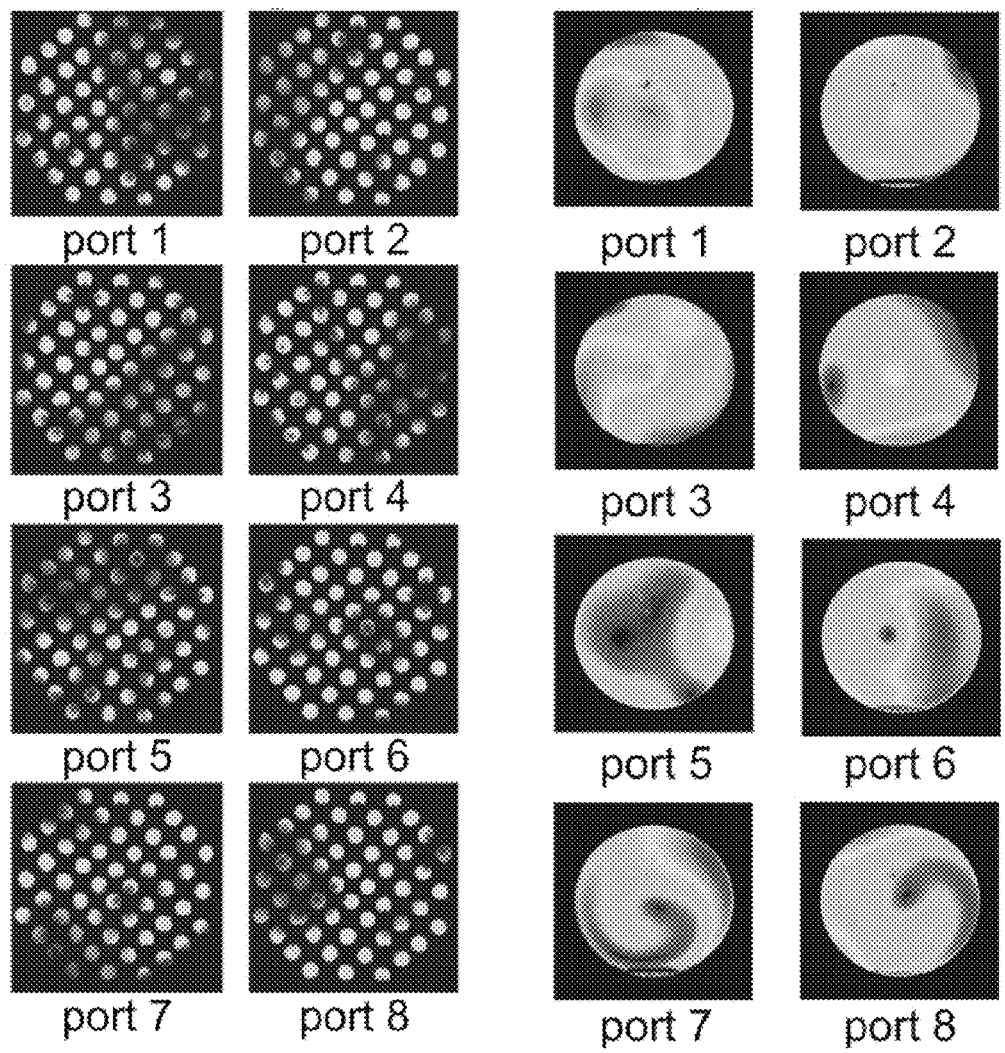
Fig. 15a
Fig. 15b
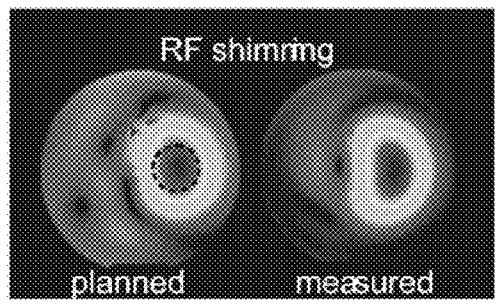
Fig. 15c

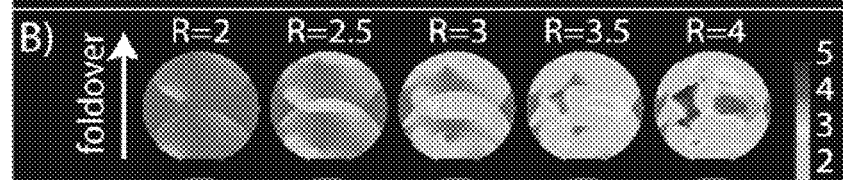
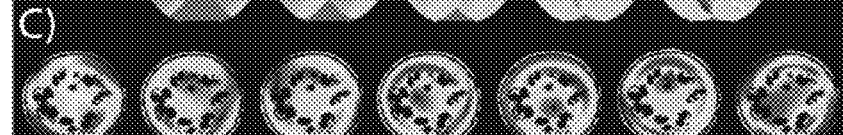
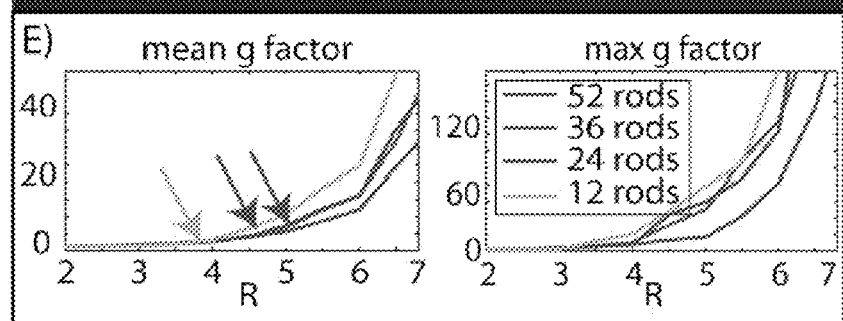
Fig. 16a
Fig. 16b
Fig. 16c
Fig. 16d
Fig. 16e

TRAVELLING-WAVE NUCLEAR MAGNETIC RESONANCE METHOD

CROSS REFERENCE TO RELATED APPLICATIONS

This application claims the benefit of PCT Application No. PCT/EP2009/002846, filed on Apr. 17, 2009 and European Patent Application No. 08007601.1, filed Apr. 18, 2008, the disclosures of which are herein incorporated by reference in their entirety.

FIELD OF THE INVENTION

The present invention generally relates to nuclear magnetic resonance imaging and/or spectroscopy.

BACKGROUND OF THE INVENTION

Nuclear Magnetic Resonance Imaging (henceforth: MRI), in particular for imaging of selected portions of a patient or another object, has so far relied on two main categories of radiofrequency (RF) coils, as generally described in U.S. Pat. No. 4,920,318. The first type is a volume resonator dimensioned to be disposed around the entire object or patient to be imaged or around a portion thereof. The other type of coil is generally formed by wrapping wire or other conductors on a flat dielectric sheet shaped in such way to be positionable adjacent the portion to be imaged.

There is a strong trend in MRI technology to go to ever higher static magnetic field strengths. The benefits of this trend are a stronger intrinsic signal yield due to the stronger polarization, increased contrast mechanisms such as BOLD or phase contrast, and greater spectral separation for spectroscopic imaging. Since MRI is generally a technique limited by signal to noise ratio (SNR), the increase in SNR and contrast achievable by increasing the static magnetic field strength enables higher spatial and temporal resolution.

However, an increase in static magnetic field strength requires a concomitant increase in operating radiofrequency. As a consequence, the wavelength of the RF radiation is shortened correspondingly. For example, the vacuum wavelength of the RF used on a 7 Tesla system is 1 m, and it can shrink down to 10 cm in human tissue due to the high permittivity of the material. Since the so-called near field of a conductive structure generally scales with the wavelength under consideration, the near field domain of conventional MRI RF probes when used at such high static magnetic fields will shrink below the typical sample size in human MRI. Moreover, as such RF probes are targeted to work with the sample in their near field, they reach their operating limits and have bad prospects for application if one were to go to even higher field strengths.

In practice, the problems arising when the resonant structures presently used for nuclear magnetic resonance (henceforth: NMR) signal probing are taken to high field strengths are a loss of efficiency and—more detrimentally—a spatially inhomogeneous coupling and a reduction of the size of the volume that can be imaged. Most of these problems arise due to interference effects of the RF electromagnetic field emitted and/or received by the probe. For instance, constructive interference yields a signal overshoot in the center region of brain scans obtained using standard resonators, while temporal regions of the head suffer from destructive interferences. In the case of transmission, these field inhomogeneities can induce changes in contrast throughout the image, thus impeding diagnostics. Furthermore, since the sample is placed in the near field domain of the probe, the interaction between probe and sample is strong and increases with higher frequency.

Moreover, the probe design becomes more intricate because resonator and coil design suffers from reduced robustness due to variable loading in in-vivo applications and because current distributions on the conductive structures of the probe are harder to control.

Finally, safety aspects become very intricate due to the strong coupling between sample and probe. RF induced heating is one of the major concerns, especially at higher frequencies. Slight changes of patient geometry next to the probe conductor can crucially change the situation, and worst case scenarios are hard to determine. Safety validation thus becomes a time consuming step in the development of new MRI probes, especially for transmit probes.

SUMMARY OF THE INVENTION

It is the principal object of the present invention to overcome the limitations and disadvantages of currently known MRI methods and devices, particularly with regard to their applicability with high static magnetic fields.

According to one aspect of the invention, a method for acquiring an image or spectrum of a subject or object residing within the magnetic field of a magnetic resonance apparatus comprises the steps of:
  executing a predetermined pulse sequence for applying gradient magnetic fields and for coupling in electromagnetic excitation pulses to induce nuclear magnetic resonance within the subject or object;
  detecting an electromagnetic signal resulting from said magnetic resonance; and
  constructing at least one image or magnetic resonance spectrum of said subject or object from said detected electromagnetic signal;
said coupling in of the electromagnetic excitation pulse and/or said detecting of the electromagnetic signal being carried out substantially by means of travelling electromagnetic waves.

The method is particularly useful for MRI, but it is also applicable for bulk or spatially resolved NMR spectroscopy.

According to another aspect of the invention, an apparatus for magnetic resonance imaging comprises a cavity for placing therein a subject or object to be imaged, means for applying a static magnetic field, means for applying gradient magnetic fields, means for coupling in an electromagnetic excitation pulse having a predetermined operating frequency to induce magnetic resonance within the subject or object and means for detecting an electromagnetic signal resulting from said magnetic resonance, said cavity having a lowest cut-off frequency that is smaller than said operating frequency when filled with the object and/or other dielectric material.

According to a further aspect of the invention, a travelling wave is used for excitation and/or detection in a nuclear magnetic resonance imaging or nuclear magnetic resonance spectroscopy apparatus.

The invention utilizes travelling rather than standing RF waves to excite and detect magnetic resonance signals.

Although a freely travelling wave cannot be established inside the bore or cavity of a magnetic resonance apparatus, it is nonetheless possible to generate a travelling wave within the bore and its RF shield or simply just within the object to be imaged. This is due to the fact that an elongated structure such as, for example, a cylindrical, electrically shielded cavity for MRI will act as a waveguide for any electromagnetic radiation having a wavelength shorter than a certain cut-off wavelength. This basic principle is well-known and is routinely used in microwave technology but is in stark contrast to currently known MRI technology operating under conditions where the RF wavelength is longer than the cut-off wavelength.

Surprisingly, it was now found that MRI can be carried out in a regime with travelling electromagnetic waves.

The invention relies on the physical principle that a travelling (i.e. propagating) electromagnetic wave has maximum homogeneity and transverse polarization down to arbitrarily small wavelengths. Wave propagation translates the field curvature that is required by electrodynamics partly or wholly into spatial variation of the phase of the oscillating fields and thus reduces or, in the limiting case, eliminates their magnitude variation. Travelling RF waves thus enable more uniform coverage of extended objects. Furthermore, travelling RF waves are a natural means of exciting and detecting magnetic resonance across larger distances than is possible with local resonators.

For a current 7 Tesla system with a cylindrical bore having a diameter of 580 mm, the lowest cutoff frequency is 303 MHz (TE mode). As the operating frequency for proton NMR is 298.04 MHz, a slight dielectric filling of the bore will enable RF propagation. In fact, even without dielectric filling, placing a large enough dielectric sample into the bore is sufficient to lower the cutoff frequency below proton NMR frequency.

Moreover, in situations where the operating frequency remains slightly below the lowest cutoff frequency in certain regions of the bore, a frustrated transmission is possible to the regions where the dielectric sample itself allows transmission, thus resulting in a situation that is substantially equivalent to a travelling wave situation.

In order to couple to the bore as a waveguide, various possibilities can be used known from microwave applications, such as feeding struts, slotted cavities and others.

In particular, one can use a patch antenna or a cross-folded dipole antenna.

In order to obtain scans of small objects and to improve the field distribution in the object or subject, the bore can be dielectrically loaded by water tanks or other dielectric objects or even with conductive objects. Such loading can be judiciously shaped to optimize the resulting RF field distribution.

It was found that by exploiting the principle of axially travelling electromagnetic waves according to the present invention, MR images can be taken at distances as large as 70 cm from the sample with a signal level that is comparable to that of traditional resonators.

Especially in transmission mode, a travelling wave operation has prospects for a highly homogeneous excitation.

The safety validation of such systems is facilitated by the fact that the electromagnetic field distribution inside the subject or object of interest is mainly given by the mode structure of the subject or object inside the bore. The antenna device can be considered as separately feeding these modes.

Furthermore, no near field interactions have to be considered. Hence the evaluation of the probe device and the compliance testing for a subject can be separated.

In particular, the principles of the present invention allow detection of NMR signals from large samples and thus may obviate the need of a body coil.

The cost of a conventional transmit/receive resonator at the frequencies of interest is substantially larger than that of the simple antenna devices adopted for the present invention.

According to a further aspect of the invention, a method for acquiring an image or a spectrum of a subject or object residing within the magnetic field of a magnetic resonance apparatus comprises the steps of:
  executing a predetermined pulse sequence for applying gradient magnetic fields and for coupling in electromagnetic excitation pulses to induce nuclear magnetic resonance within the subject or object;
  detecting an electromagnetic signal resulting from said magnetic resonance; and
  constructing at least one image or magnetic resonance spectrum of said subject or object from said detected electromagnetic signal;
said coupling in and/or detection of the electromagnetic excitation pulse being carried out substantially by means of an axially travelling electromagnetic wave in said cavity propagating from a proximal cavity end to a distal cavity end, said axially travelling wave comprising a plurality of more than two linearly independent propagating field patterns.

In an idealized, infinitely long waveguide, orthogonal RF modes can propagate ideally, maintaining their unique transverse field distributions along the propagation axis. In a long but finite waveguide, propagating field patterns are observed that closely approximate the behavior of cavity modes.

In a sample to be imaged, placed at the proximal end of such a finite length waveguide, each linearly independent field pattern gives rise to a distinct sensitivity pattern. The orthogonality of the field patterns is beneficial for parallel transmission. Therefore, selective coupling to these field patterns is desirable. However, the simultaneous excitation of multiple linearly independent field patterns in a waveguide is a demanding task, which requires that the location and the type of the exciting elements be chosen carefully.

According to one embodiment, the travelling wave is generated by means of a plurality of transmitter elements located at a proximal end of said cavity, and the travelling wave is detected by means of a plurality of receiver elements located at said proximal cavity end.

In an advantageous embodiment, the transmitter elements are configured as stubs and/or loops.

In a particularly advantageous embodiment, linearly independent propagating field patterns are established by means of a plurality of dielectric inserts arranged within said cavity between said proximal cavity end and a cavity region for receiving the subject or object. These dielectric inserts lower the cut-off frequencies of the higher order field patterns.

In principle, the dielectric inserts can have a range of shapes, e.g. spherical or disk-shaped. In particular, the dielectric inserts are shaped as elongated elements arranged co-axially to each other and to a longitudinal axis of said cavity.

According to still another aspect of the invention, an apparatus for magnetic resonance imaging or spectroscopy comprises a cavity for placing therein a subject or object to be imaged, means for applying a static magnetic field, means for applying gradient magnetic fields, means for coupling in electromagnetic excitation pulses having a predetermined operating frequency to induce nuclear magnetic resonance within the subject or object and means for detecting an electromagnetic signal resulting from said magnetic resonance. Said cavity, when loaded with the subject or object to be imaged, has a lowest cut-off frequency that is smaller than said operating frequency. The apparatus further comprises a plurality of transmitter elements located at a proximal cavity end, a plurality of receiver elements located at a distal cavity end and a plurality of rod-like dielectric elements arranged co-axially within said cavity between said proximal cavity end and a cavity region for receiving the subject or object.

Advantageously, the dielectric inserts are shaped as elongated elements arranged co-axially to each other and to a longitudinal axis of said cavity.

However, each transmitter element can be operated as a receiver element in the pulse sequence, and vice versa.

Implementations

Single Distant Transmitter/Detector

In a basic implementation of travelling-wave transmission an RF device similar to an antenna generates a travelling wave that propagates towards and into the object to be examined. For efficient NMR excitation the wave should exhibit a large circularly polarized magnetic component transverse to the direction of the static magnetic field of the NMR system and with the sense of polarization matching that of the Larmor precession.

To increase transmission efficiency the wave propagation can be supported by a waveguide. A basic waveguide can be formed by a conductive cylindrical pipe. For most efficient waveguiding such a pipe must be of sufficient diameter, such as to exhibit a cut-off frequency not larger than the NMR operating frequency. However, for suitably short distances even undersized waveguides can be used, relying on evanescent fields that reach across limited distances. When using a waveguide the object to be examined can be placed inside or at one end of it, with the transmitter coupling a suitable wave into the waveguide.

The same sort of setup, with or without waveguide, can also be used to receive NMR signals via travelling waves. However, to be sensitive to NMR signals it must be configured such that, when driven at the receive port, it generates magnetic field of the opposite circular polarization than required for NMR excitation. Therefore a setup optimized to generate the circular polarization required for NMR excitation will need to be switched to change the sense of polarization for receive operation. This can be achieved, e.g., with a 90° hybrid switch as frequently used also for near-field quadrature probes.

A setup that generates linearly polarized waves is less efficient in either mode of operation. However it will not require any switching between transmit and receive operation because a linearly polarized wave contains circularly polarized components of both senses of rotation in equal proportion.

Compared with conventional close-coupling probes, excitation with a remotely placed transmitter has several further advantages. One is greater safety, since the risk of exposing sensitive samples to excessive short-range electric fields emanating from a (potentially malfunctioning) probe is eliminated. Safety validation is also simplified because the electromagnetic behavior of remote probes and the sample are largely separable. For the same reason the electrical performance of remote probes, especially their matching, is more stable than that of close-coupling probes.

A travelling RF wave generated by a remote transmitter will generally undergo common wave phenomena such as reflection, diffraction and interference effects when entering a sample of different dielectric properties. To mitigate these effects tailored distributions of dielectric material or electric circuits can be introduced to optimize the wave coupling into the sample. This approach is analogous to wave impedance matching in optical and microwave technology.

Multiple Distant Transmitters/Detectors

Following the same principles travelling-wave transmission can also be performed with multiple, simultaneously operated transmitter elements, super-imposing their individual field contributions. In such a setup the different transmitter elements can be driven individually, permitting improved control of the resulting field distribution. For instance, the driving configuration can be varied to optimize the field uniformity and polarization, the direction of propagation, the utilization of different waveguide modes etc.

Multiple travelling-wave transmitters can likewise be used for simultaneous reception in analogy to the established principles of array detection in near-field conditions.

Closely Mounted Travelling-Wave Transmitter(s)

To improve the uniformity of RF coverage at short wavelength it is sufficient to establish travelling waves inside the sample while it is not necessary to place the probes remotely. A travelling wave inside a sample can also be established by a suitably designed and operated close-coupling device, e.g., by an array of coil elements with phase and amplitude relationships designed to jointly generate a travelling wave inside the sample. This can be done by driving each element individually through a separate transmit chain or by a suitable configuration of RF splitters, phase shifters and attenuators. In terms of hardware such a setup closely resembles existing multiple-channel transmit systems for MRI. However it needs to be operated specifically to produce the phase and amplitude relationships that give rise to substantial wave propagation in the sample.

A close-coupling travelling-wave transmitter can also be implemented in more integrated forms, combining components such as coils, strip-lines and lumped passive components in a spatially extended configuration. Such a setup may exploit coupling between neighboring transmitter modules to generate the desired phase and amplitude relationships of transmitter currents. In all of these setups power amplification can be kept remote or integrated close to or on the transmitters.

Combination of Travelling- and Non-Travelling Wave Coupling

For certain purposes it will be beneficial to combine travelling-wave coupling and conventional close-range coupling in the same experiment. For example, to reconcile uniform excitation with maximum reception sensitivity, it is attractive to use travelling-wave transmission for excitation and a conventional, close-coupling receiver array for detection. All of the mechanisms described above can be used for transmission or reception in combination with any other mechanism for the respective other operation.

BRIEF DESCRIPTION OF THE DRAWINGS

The file of this patent contains at least one drawing executed in color. Copies of this patent with color drawing(s) will be provided by the Office upon request and payment of the necessary fee.

The above mentioned and other features and objects of this invention and the manner of achieving them will become more apparent and this invention itself will be better understood by reference to the following description of various embodiments of this invention taken in conjunction with the accompanying drawings, wherein:

FIGS. 1 *a-b* show examples of conventional NMR coil designs according to the prior art, namely: a) a simple loop coil, and b) a birdcage type of resonator;

FIGS. 4 *a-b* show the principle of travelling wave generation in an object/subject by means of a) local RF transmitters and b) by remote RF irradiation, with the varying phase of the travelling waves depicted by varying line thickness and texture;

FIGS. 8 a-d show phantom experiments using bottles filled with mineral oil; slice a) was taken while the bore was able to support a travelling wave with minor reflections at both ends of the sample, b) shows the same slice taken without the matching oil bottles, c) shows the transverse field distribution and d) shows the longitudinal field distribution for the two cases;

FIGS. 9 a-b show examples of in vivo application on imaging the feet of a healthy human subject, a) using a travelling wave mode on a 7 Tesla scanner, and b) in the conventional near field mode recorded on a clinical routine 3 Tesla system using a body coil resonator shown here for comparison;

FIG. 10 shows a perspective view of a patient in a cavity of an apparatus for in vivo whole body MRI by means of an axially travelling wave (propagating from right to left);

FIG. 11 shows schematically two linearly independent propagating field patterns ("modes") of an axially travelling wave (propagating from left to right);

FIGS. 12 a-b show a bore extension with stubs and loops for excitation and with dielectric inserts;

FIGS. 15 a-c show measured relative intensities of the receive sensitivities, a) in the dielectric stubs, b) in a cylindrical phantom, and c) planned and measured shim;

FIGS. 17 a-e show a) receive sensitivities of the eight waveguide ports, b) g-factor maps for Cartesian SENSE imaging with varying acceleration factor R, c) receive sensitivities in a water melon, d) Full-Fourier (left) and SENSE imaging (right) of the melon, e) mean and maximum g-factors as the dielectric filling of the waveguide is gradually reduced.

DETAILED DESCRIPTION OF THE PREFERRED EMBODIMENT

Conventional coil designs laid out for operation in a near-field regime are shown in FIGS. 1 a) and 1b). In particular, FIG. 1 a) shows a simple loop coil comprising an inductor that is made resonant at the nuclear magnetic resonance frequency of interest by means of a capacitor. FIG. 1 b) shows a birdcage type of volume resonator with a plurality of struts and capacitors that can produce a transverse (circularly) polarized magnetic field. Both probes are intended to be arranged so that the sample is in the near field of the probe.

Figure 2:
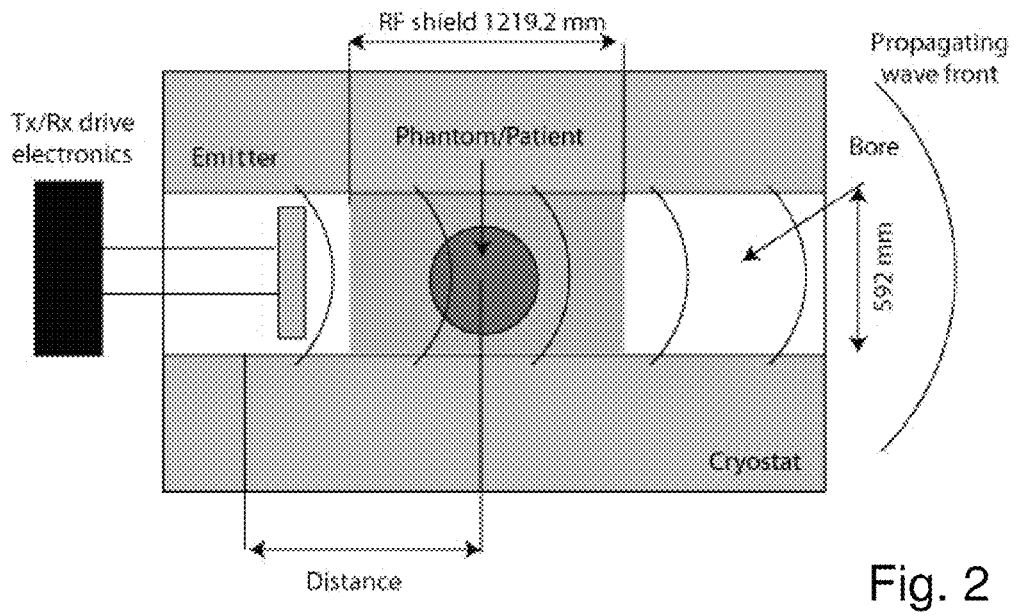
FIG. 2 shows a longitudinal section of an MRI apparatus operating in a travelling wave mode.
Figure 3:
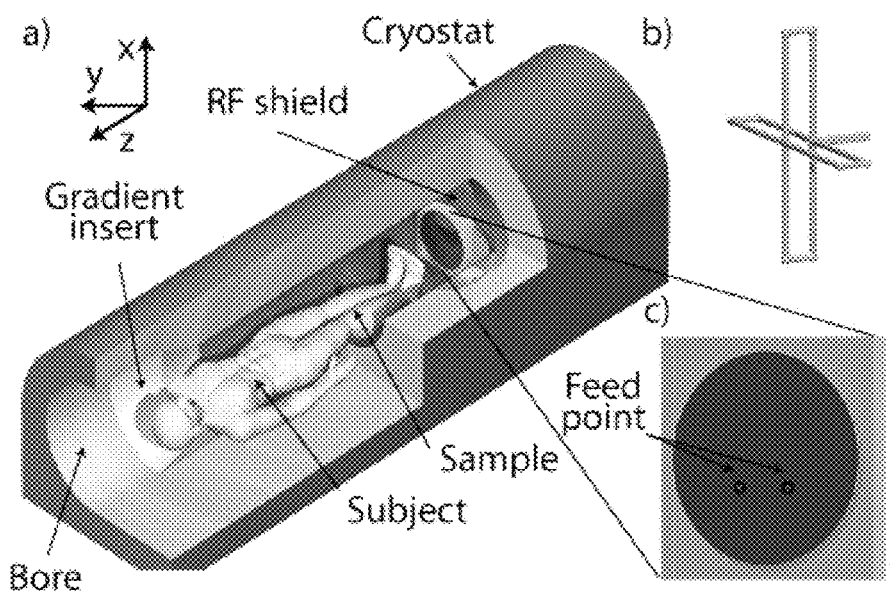
FIGS. 3 *a-c* show a perspective view of an apparatus for in vivo whole body MRI by means of an axially travelling wave, namely: a) a section cut of the cryostat with the sample, b) a crossed folded dipole probe, and c) a patch antenna.

The arrangement shown in FIGS. 2 and 3 illustrates an MRI apparatus operating in a longitudinal travelling wave mode. Typical dimensions are a bore diameter of 592 mm and a central RF-shielded channel section with a length of about 1,220 mm. An emitter antenna, in this example a planar patch antenna with two feed points as shown in FIG. 3 c), emits electromagnetic waves propagating along the bore, with the latter acting as a waveguide. For signal detection, it is possible to use either the same patch antenna or an appropriately configured detection antenna such as a crossed folded dipole probe as shown in FIG. 3 b). It is also possible to place the reception antenna on the other side of the subject or sample, e.g. at the other end of the bore or even outside the bore at a distance therefrom.

Another advantageous combination is that of travelling-wave excitation, using, e.g., either of the aforementioned antennae, with conventional near-field detection, using a conventional detector coil or an array of such coils.

FIG. 4 shows a comparison of two basic principles of travelling wave generation in an object of interest. The arrangement shown in FIG. 4a) comprises a plurality of four coil elements E1, E2, E3 and E4 acting as local RF transmitters which are operated with phase and amplitude relationships designed to jointly generate a travelling wave inside the object. As mentioned above, this can be done by driving each element individually through a separate transmit chain or by a suitable configuration of RF splitters, phase shifters and attenuators. In contrast, FIG. 4b) shows the operation in a remote RF irradiation mode, where a travelling wave is generated from a transmitter located at a distance from the object.

The practical implementation is further illustrated in the following examples.

Example 1

Travelling Wave MR on a Whole Body System

Theory

A propagating plane wave in free space would have maximum homogeneity and transverse polarization down to arbitrarily small wavelengths. Whereas a freely propagating wave cannot be established inside the bore of an NMR magnet, a travelling wave can still be guided by the bore and its RF shield. The modes of the empty bore of typical whole-body 7 Tesla systems (see FIG. 5 a) have cutoff frequencies slightly above the proton Larmor frequency. Therefore filling the bore with a preferably lossless dielectric material (in addition to the subject or sample, FIG. 5 c) can reduce the cutoff frequencies of the first modes sufficiently ([2]) to support wave propagation at the proton MR frequency.

Figure 5:
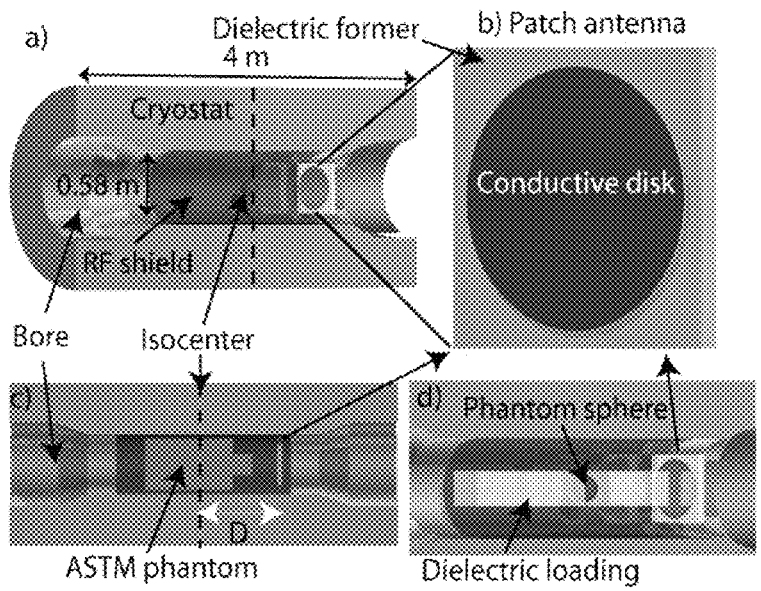
FIGS. 5 a-d show an experimental setup used for phantom experiments, wherein a) shows the cryostat with a 15 cm sphere located at its isocenter, b) shows the patch antenna used for most of the experiments, c) shows a setup for the measurement with an ASTM phantom and d) shows the location of the sphere present with the dielectric filling used to allow the waves to travel throughout the bore.

In order to prevent axial standing waves stemming from reflections due to guided mode mismatches at the dielectric interfaces of the subject, a dielectric load tapering towards the subject can be placed at the center of the bore (FIG. 5 d).

Additionally, dielectric loading of judicious geometry can be used to shape the transverse field pattern of the mode. Such a setup could provide highly homogenous RF fields in the axial direction if the standing wave ratio can be kept low enough. Furthermore the field patterns (dominated by the mode structure of the loaded bore) are expected to be largely independent of the probing device, which could ease the safety assessment of novel probe designs.

Methods

Two RF probes were constructed, a 350 mm diameter circular patch antenna [1] with quadrature driving ports on a PMMA former (400 mm side length, 30 mm thick) with copper backplane (see FIG. 4 b) and a pair of crossed folded dipole antennas of 250 mm length driven in quadrature. The ports of the patch antenna were matched by attaching the feeding posts directly to 50Ω impedance points on the disk [1]. Imaging experiments were carried out on a 7 T Philips Achieva whole body system using standard quadrature RF coil interfaces. The RF probes acted as transmit-receive devices in all experiments, and in reception the two quadrature channels were acquired independently. For imaging, a standard small flip-angle gradient-echo sequence (FLASH) was used without averaging.

Experiments and Results

Figure 6:
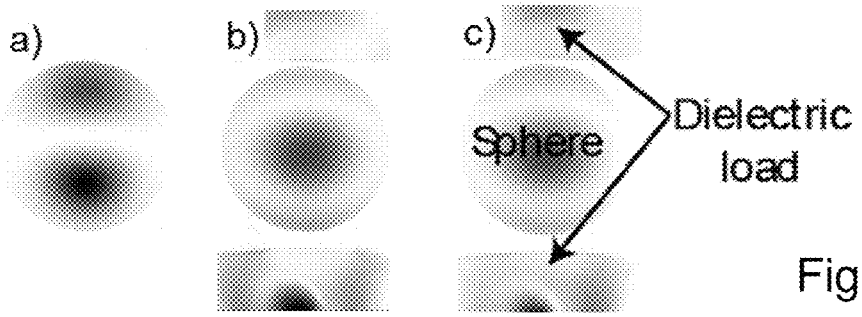
FIGS. 6 a-c illustrate a phantom experiment showing a) a coronal view of a 15 cm sphere in the bore, b) the same slice of the sphere with a dielectric loading present making the bore around the sphere radiative, and c) the same image taken in b) but using the crossed folded dipoles instead of the patch antenna.

For all experiments the antennas were placed at one end of the bore's RF shield at 65 cm distance from the isocenter (FIG. 5 a, b). Using the patch antenna, a central coronal image was taken from a 15 cm saline water sphere placed at isocenter without dielectric load (FIG. 6 a). The same image was taken using ten 3-liter demineralized water containers for dielectric loading (see FIG. 5 d) and replacing the patch by the folded dipole (FIG. 6 b, c). It is seen that the dielectric matching affects the excitation pattern greatly. However, exchanging the RF probe did not change the received image significantly.

Figure 7:
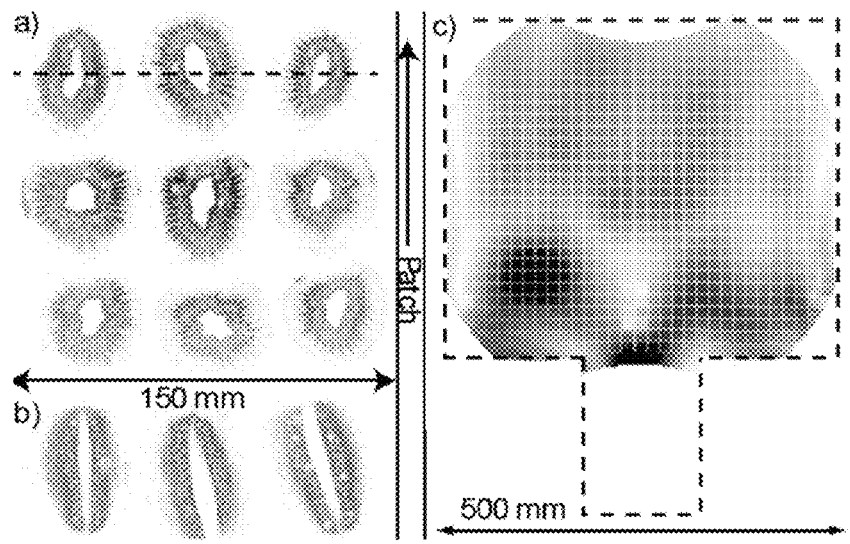
FIGS. 7 a-c show a) a high resolution imaging example of nine kiwi fruit placed at the isocenter of the magnet with dielectric loading present, and b) an image taken with the same setup as a) but transverse to the bore at the position indicated by the dashed line in a), whereas c) is an image of an ASTM torso phantom filled with gelled water.
Figure 13A:
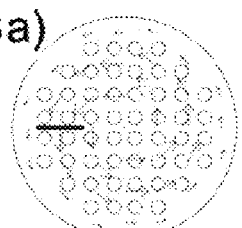
FIGS. 13 a-d show modes and feed positions in the bore.
Figure 13B:
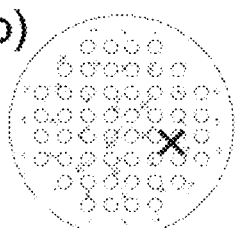
Figure 13C:
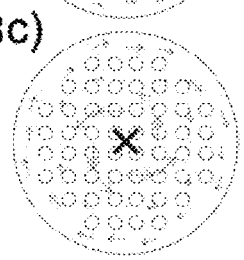
Figure 13D:
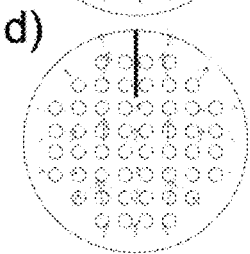

Using the dielectric loading, coronal images of nine kiwi fruit (*Actinidia Chinensis*) arranged in a 3×3 array were acquired. The resulting high resolution (0.375×0.375×2 mm$^3$) image in FIG. 7 a) shows excellent SNR with a probe that is actually 60 cm away from the sample. FIG. 7 b) shows a transverse slice placed as marked by the dashed line in FIG. 7 a), illustrating homogeneous coverage also in the third dimension. Whole body imaging was mimicked using a standardized ASTM [3] phantom filled with gelled water (conductivity of human tissue, permittivity basically of water). FIG. 7 c) shows the resulting coronal image acquired using the maximum possible FOV of 500 mm with an in-plane resolution of 1 mm. The coverage thus achieved is visibly inhomogeneous but nevertheless remarkable for "whole-body" imaging at 7 T.

Simulations

Electromagnetic model calculations were carried out using the CST Microwave Studio® software. The results confirmed that although the empty bore has a cutoff frequency of about 303 MHz, very little dielectric loading allows a travelling wave to be established. Furthermore it was found that the transverse field distribution can be altered and unwanted reflections can be lowered by tapering the dielectric interfaces of the subject.

Conclusion

It has been shown that MR excitation and detection by axially-travelling waves is feasible and quite efficient at 7 T. High SNR and good coverage was achieved in smaller samples as well as in a whole-body phantom, using an antenna that was placed a remarkable 65 cm away. The excitation pattern produced does not significantly depend on the probe used which indicates the dominance of the mode structure of the loaded bore system. The mode structure can be significantly influenced by dielectric loading of the bore thus allowing various degrees of freedom to manipulate the electromagnetic fields for optimal imaging performance.

Example 2

Phantom Experiments

Further phantom experiments using bottles filled with mineral oil are shown in FIG. 8. The field of view of the images is 530 mm in z direction. The slice of FIG. 8 a) was taken while the bore was able to support a travelling wave with minor reflections at both ends of the sample. This was achieved by additional oil bottles of the same diameter placed in the axis of the bore matching the impedance of the modes in the bore to the ones in the sample-filled bore. For comparison the same slice was taken without the matching oil bottles present, see FIG. 8 b). The longitudinal profile taken from both slices depicted in FIG. 8 d) show clearly the enhanced homogeneity in axial direction while the transverse field distribution stays unchanged, as shown in FIG. 8 c).

Example 3

In Vivo Imaging of Feet

An example of an in vivo application is given in FIG. 9, which demonstrates MR imaging of a foot of a healthy human subject. The image of FIG. 9 a), which was taken in the travelling wave mode, has comparable quality to the reference image shown in FIG. 9 b), which was taken with a conventional 3 T device (birdcage-type body resonator operating at 128 MHz, i.e. the proton MR frequency at 3 T) in near-field mode using the same sequence timings and parameters. However, the field of view in the travelling wave mode was found to be substantially larger and was only limited by the range of the encoding gradient fields. Moreover, an improvement in SNR as compared to the near field mode was found for the travelling wave mode.

Parallel Travelling Waves

In the examples described so far, a parallel imaging concept was implemented by using a patch antenna with two ports to excite the two degenerate $TE_{11}$ modes of a circular waveguide, which are the only modes below cut-off in an empty bore at 7 Tesla. However, it would be desirable to extend the travelling wave concept for parallel transmit so as to have more than two independent channels that each excite linearly independent field patterns in the object.

The general arrangement of a patient in an apparatus for in vivo whole body MRI by means of a plurality of axially travelling waves is shown in FIGS. 10 and 11. In this configuration, a travelling wave propagating in forward direction F is generated by means of a plurality of transmitter elements (not shown) located at a proximal end P of a cavity C. Several linearly independent propagating field patterns are established by means of a plurality of rod-like dielectric inserts R arranged within the cavity between the proximal cavity end P and a cavity region for placing therein a patient. The transmitted travelling wave is then detected by means of a plurality of receiver elements (not shown) located at a distal end D of the cavity.

It is understood that each transmitter element can be operated as a receiver element in the pulse sequence, and vice versa.

In the following examples, the term "waveguide modes" will occasionally be used instead of "propagating filed patterns".

Example 4

The cylindrical RF shield of a 7 T Philips Achieva whole-body scanner (Philips Healthcare, Cleveland, Ohio) bore (0=580 mm, L=1.3 m) was extended with a 2 m long, 560/542 mm (inner/outer diameter) polyethylene (PE) tube. The extension was inserted coaxially into the scanner's bore. A circular waveguide structure was formed by fixing brass mesh on the tube. The extension was terminated with a short plane on one end (see FIG. 12a). This forces the wave into the scanner, reduces noise from radiation, and simplifies coupling to the waveguide modes.

A dielectric insert was designed to lower the cut-off frequencies of the higher order modes. Filling the extension completely with a dielectric material would be too heavy. Therefore, 2 m long PMMA tubes filled with distilled water, arranged in a Cartesian grid along the z-direction (see FIG. 12b) were used. The effective material of this insert can be approximated as a homogeneous material with an anisotropic permittivity tensor, shown in Eq (1)

$$[\varepsilon] = \begin{bmatrix} \varepsilon_{r,MG} & 0 & 0 \\ 0 & \varepsilon_{r,MG} & 0 \\ 0 & 0 & \varepsilon_{ave} \end{bmatrix} \quad (1)$$

where $\varepsilon_{r,MG}$ is computed with the Maxwell-Garnett formula [4], and $\varepsilon_{ave}$ is the average permittivity of this material.

The modal distributions and the cutoff frequencies of the actual 2D geometry were simulated using the 2D-modal solver of COMSOL (FEM). The simulation showed that 17 modes are supported by this waveguide at 300 MHz. Table 1 shows these modes together with the simulated cut-off frequencies $f^c_{n,m}{}'$, the cut-off frequencies of these modes in the empty waveguide $f^c_{n,m}$, the equivalent permittivity $\varepsilon'_{hom,eq}$ for each mode (for a homogeneous, isotropic filling), and the wavelength of the mode with insert at 300 MHz.

TABLE 1

Cut-off frequencies, eq. permittivities, and wavelenghts of the bore extension with inserts. Excited modes are marked.

|  | Mode | $f^c_{n,m}$ [MHZ] | $f^c_{n,m}{}'$ [MHZ] | $\varepsilon'_{hom,eq}$ | $\lambda$ [m] |
|---|---|---|---|---|---|
| port 1 → | $TM_{01}$ | 411 | 85 | 23.4 | 1.04 |
| port 2, 3 → | $TN_{11}$ | 654 | 136 | 23.1 | 1.13 |
| port 4, 5 → | $TM_{21}$ | 876 | 187 | 21.9 | 1.29 |
| port 6 → | $TM_{02}$ | 942 | 193 | 23.8 | 1.32 |
|  | $TM_{31}$ | 1089 | 225 | 23.4 | 1.53 |
| port 7, 8 → | $TE_{11}$ | 314 | 246 | 1.6 | 1.78 |
|  | $TM_{12}$ | 1196 | 248 | 23.3 | 1.81 |
|  | $TM_{41}$ | 1293 | 266 | 23.6 | 2.23 |
|  | $TM_{22}$ (I) | 1435 | 284 | 25.5 | 3.32 |
|  | $TM_{03}$ | 1176 | 291 | 25.7 | 1.67 |
|  | $TM_{22}$ (2) | 1435 | 297 | 23.3 | 12.29 |

Excitation elements targeting 8 modes (indicated by arrows in Table 1) were included. The positions of the excitation elements were determined based on the modal field distribution, computed by simulations.

The $TE_{11}$ modes were excited with stubs on the cylindrical shell of the extension, the TM-modes with stubs and a loop on the backplane for the $TM_{01}$ mode [5], see FIG. 12a.

As an example, the modal field distributions for four modes are shown in FIG. 13, the crosses and lines indicate the positions of the stubs and loop (FIG. 12a) on the backplane and on the outer shell of the extension, see also FIG. 12b. The lengths of the stubs and the loop were adjusted to match the individual ports.

Figure 14:
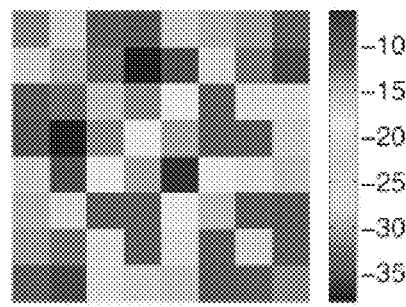
FIG. 14 shows the measured S-parameter in dB.

The scattering matrix measured with a VNA for the unloaded bore extension is shown in FIG. 14. The ports are well decoupled. This implies that the ports do not couple into the same mode. For imaging experiments a Philips Achieva 7 T scanner with MultiX system was used with 8 independent transmit/receive channels. The ports of the waveguide extension were used in transceive mode. The excitation pattern of each port was measured by placing the insert waveguide into the isocenter. The remaining part of the bore was left empty. Low flip angle gradient echo images were acquired to measure the relative intensities of the receive sensitivities, see FIG. 15a. Selective mode excitation was de-graded due to coupling into the higher order modes (modes 9 to 17) and due to coupling in the feeding structure. However, this diverse field distribution in the bore extension translates into a diverse field distribution in the sample (cylindrical phantom, ⌀20 cm L=30 cm, $\varepsilon_r$=58, σ=0.78 S/m), shown in FIG. 15b. In FIG. 15c, localized RF-shimming was applied to the phantom, trying to focus the excitation within the dashed circle.

Conclusion

Dielectric filling of a waveguide allows excitation of spatially distinct field patterns in the sample using traveling wave modes. This can be used for parallel transmission enabling RF-shimming as well as for parallel receive. The dielectric insert allows for selective modulation of the cut-off frequencies of the modes. This concept can be further optimized by changing the dielectric material, or the distribution of the tubes.

Example 5

Figure 16:
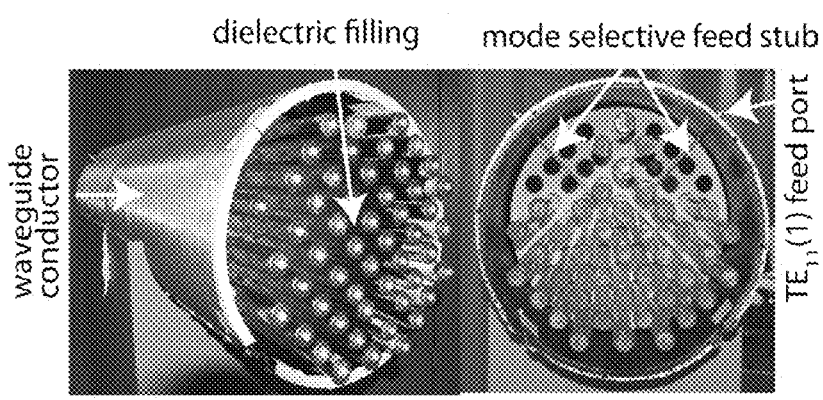
FIGS. 16 a-b show pictures of the bore extension filled with a variable number of water-filled rods to enhance its mode diversity.

To provide the necessary mode diversity a dielectrically filled, shielded bore extension was used (FIG. 16), which fits into the bore of a 7 T Philips Achieva whole-body scanner (Philips Healthcare, Cleveland, Ohio). When fully filled with 52 water-filled rods, the eightport extension carries up to 17 RF modes. The design and transmit properties of this device are reported in the above Example 1. Its ports were equipped with T/R switches and connected to the eight-channel MultiX transmit system and the spectrometer of the 7 T system. Receive sensitivity maps were recorded in a transverse plane of a cylindrical phantom (⌀=20 cm, length=30 cm) filled with tissue-simulating liquid ($\varepsilon_r$=58, σ=0.78 S/m) and are plotted in FIG. 17A. From the receive sensitivities g-factor maps (FIG. 17B) were calculated for a series of reduction factors R, showing that the field diversity is readily sufficient for parallel imaging with up to 3-fold acceleration.

Because of concern regarding volunteer safety, initial imaging of a natural sample was limited to a water melon. FIG. 17C shows receive sensitivity maps from a transverse slice through the melon. Gradient-echo imaging with full Fourier encoding and Roemer reconstruction [6] based on the sensitivity maps yielded the image shown in FIG. 17D (left), which also relied on RF shimming for uniform excitation. Travelling wave parallel detection was then used for SENSE imaging [7] with 2.5-fold and 4-fold acceleration in the same plane. The resulting images in FIG. 17D (right) show spatially varying noise enhancement as expected from the g-factor maps but otherwise match the full-Fourier counterpart, thus proving the feasibility of parallel imaging.

The dependence of the parallel imaging performance on the mode diversity of the waveguide was studied by gradually decreasing its dielectric filling. The number of dielectric rods was reduced from 52 (17 modes) to 36 (13 modes), 24 (10 modes), and 12 (5 modes), maintaining a maximum degree of symmetry in the transverse plane. Without any filling the ports of the empty waveguide could no longer be matched and no MR signal could be observed, reflecting the expected lack of any propagating mode. However, as the plots in FIG. 17E show, as few as 12 rods, enabling 5 modes, were sufficient for reasonable parallel imaging with common acceleration rates. Higher acceleration factors eventually exceed the mode diversity, leading to disproportionate g-factor increases whose onset is indicated by arrows in the graph.

Conclusion

Parallel imaging can readily rely on travelling-wave detection if a sufficient number of propagating modes is available. The mode diversity depends on the bore width, the Larmor frequency and the amount of dielectric filling. For a Larmor frequency of 300 MHz and a typical whole-body bore width a small amount of dielectric filling has been found sufficient to support parallel imaging with common acceleration rates. This filling took up less than 5% of the bore cross section. It is thus relatively easy to mount and manipulate and is expected to have little effect on the comfort of human subjects. The use of travelling-wave coupling enables parallel imaging with detection across substantial distances (2 m in this case) and without the need for a close-coupling receiver array. It is most feasible in ultra-high-field conditions and will benefit from even higher Larmor frequencies and larger waveguide diameters. Important open questions concern the dielectric filling configuration and the placement and nature of the waveguide ports. Both have been implemented based on basic simulation results in the present work but can likely be improved by design optimization. An important limitation of travelling wave detection is its limited sensitivity, which stems from intrinsic long-range RF coupling to lossy materials in the setup and which thus makes it an alternative to body resonators rather than local receiver arrays.

REFERENCES

[1] C. A. Balanis, Antenna Theory: Analysis and Design, Wiley (1997).
[2] C. A. T vandenBerg et al, ISMRM workshop Advances in high field MRI Asilomar, Mar. 25-28, 2007.
[3] American Society for Testing and Materials, Designation: F 2182-02-a-Standard Test Method for Measurement of Radio Frequency Induced Heating Near Passive Implants During Magnetic Resonance Imaging.
[4] Wu et al., Electromagnetics, 21: 97-114, 2001.
[5] D. M. Pozar et al., Microwave Engineering, John Wiley & Sons, Inc. New York, 1998.
[6] P. B. Roemer et al. MRM, 16: 192-225, 1990.
[7] K. P. Prüssmann et al. MRM, 42: 952-962, 1999.

The invention claimed is:

1. A method for acquiring an image or spectrum of a subject or object residing within the magnetic field of a magnetic resonance apparatus, comprising the steps of:
executing a predetermined pulse sequence for applying gradient magnetic fields and for coupling in electromagnetic excitation pulses to induce nuclear magnetic resonance within the subject or object;
detecting an electromagnetic signal resulting from said magnetic resonance; and
constructing at least one image or magnetic resonance spectrum of said subject or object from said detected electromagnetic signal;
wherein said coupling in of the electromagnetic excitation pulse and/or said detecting of the electromagnetic signal are carried out substantially by means of travelling electromagnetic waves, said travelling wave being generated by means of an antenna;
wherein said antenna is a patch antenna or a cross-folded dipole antenna.

2. The method according to claim 1, wherein said subject or object resides within a cavity of the magnetic resonance apparatus and wherein said travelling electromagnetic waves are axially travelling electromagnetic waves in said cavity.

3. The method according to claim 2, wherein said cavity is an elongated structure having electrically conducting walls.

4. The method according to claim 1, wherein the travelling wave is generated and/or detected by at least one patch antenna.

5. The method according to claim 4, wherein the patch antenna is operated in a circularly polarized mode.

6. An apparatus for magnetic resonance imaging, comprising
a cavity for placing therein a subject or object to be imaged,
means for applying a static magnetic field,
means for applying gradient magnetic fields,
means for coupling in electromagnetic excitation pulses having a predetermined operating frequency to induce nuclear magnetic resonance within the subject or object and
means for detecting an electromagnetic signal resulting from said magnetic resonance,
wherein said cavity, when loaded with the subject or object to be imaged, has a lowest cut-off frequency that is smaller than said operating frequency,
wherein said means for coupling in electromagnetic excitation pulses and/or said means for detecting an electromagnetic signal comprises an antenna,
wherein said antenna is a patch antenna or a cross-folded dipole antenna.

7. A method for acquiring an image or spectrum of a subject or object residing within the magnetic field of a magnetic resonance apparatus, comprising the steps of:
executing a predetermined pulse sequence for applying gradient magnetic fields and for coupling in electromagnetic excitation pulses to induce nuclear magnetic resonance within the subject or object;
detecting an electromagnetic signal resulting from said magnetic resonance; and
constructing at least one image or magnetic resonance spectrum of said subject or object from said detected electromagnetic signal;
wherein said coupling in and/or detection of the electromagnetic excitation pulse is carried out substantially by means of an axially travelling electromagnetic wave in said cavity propagating from a proximal cavity end to a distal cavity end;
wherein said axially travelling wave comprises a plurality of more than two linearly independent propagating field patterns.

8. The method according to claim 7, wherein the travelling wave is generated by means of a plurality of transmitter elements located at said proximal cavity end and wherein the travelling wave is detected by means of a plurality of receiver elements located at said distal cavity end.

9. The method according to claim 8, wherein said transmitter elements are configured as stubs and/or loops.

10. The method according to claim 7, wherein additional linearly independent propagating field patterns are established by means of a plurality of dielectric inserts arranged within said cavity between said proximal cavity end and a cavity region for receiving the subject or object.

11. The method according to claim 10, wherein said dielectric inserts are shaped as elongated elements arranged co-axially to each other and to a longitudinal axis of said cavity.

12. An apparatus for magnetic resonance imaging or spectroscopy, comprising
a cavity for placing therein a subject or object to be imaged,
means for applying a static magnetic field,
means for applying gradient magnetic fields, means for coupling in electromagnetic excitation pulses having a predetermined operating frequency to induce nuclear magnetic resonance within the subject or object and means for detecting an electromagnetic signal resulting from said magnetic resonance, wherein said cavity, when loaded with the subject or object to be imaged, has a lowest cut-off frequency that is smaller than said operating frequency, wherein a plurality of transmitter elements are located at a proximal cavity end, a plurality of receiver elements are located at a distal cavity end, and a plurality of dielectric inserts are arranged between said proximal cavity end and a cavity region for receiving the subject or object.

13. The apparatus according to claim 12, wherein said dielectric inserts are shaped as elongated elements arranged co-axially to each other and to a longitudinal axis of said cavity.

\* \* \* \* \*